US011343454B2

(12) United States Patent
Panicacci et al.

(10) Patent No.: US 11,343,454 B2
(45) Date of Patent: May 24, 2022

(54) IMAGING SYSTEMS AND METHODS FOR PERFORMING PIXEL BINNING AND VARIABLE INTEGRATION FOR ANALOG DOMAIN REGIONAL FEATURE EXTRACTION

(71) Applicant: SEMICONDUCTOR COMPONENTS INDUSTRIES, LLC, Phoenix, AZ (US)

(72) Inventors: Roger Panicacci, Los Gatos, CA (US); Tim W. Chan, Los Gatos, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/854,057

(22) Filed: Apr. 21, 2020

(65) Prior Publication Data

US 2021/0051290 A1 Feb. 18, 2021

Related U.S. Application Data

(60) Provisional application No. 62/887,748, filed on Aug. 16, 2019.

(51) Int. Cl.
| | |
|---|---|
| *H04N 5/372* | (2011.01) |
| *H01L 27/146* | (2006.01) |
| *H04N 5/369* | (2011.01) |
| *H04N 5/347* | (2011.01) |
| *H04N 5/355* | (2011.01) |
| *H04N 5/225* | (2006.01) |
| *H04N 5/232* | (2006.01) |

(52) U.S. Cl.
CPC ... *H04N 5/37213* (2013.01); *H01L 27/14609* (2013.01); *H01L 27/14634* (2013.01); *H04N 5/379* (2018.08)

(58) Field of Classification Search
CPC .... H04N 5/37213; H04N 5/379; H04N 5/347; H04N 5/35554; H04N 5/225; H04N 5/23229; H01L 27/14609; H01L 27/14634
See application file for complete search history.

(56) References Cited

U.S. PATENT DOCUMENTS

| | | | |
|---|---|---|---|
| 6,631,217 B1 * | 10/2003 | Funatsu | H04N 5/37452 382/307 |
| 7,190,398 B1 | 3/2007 | Yadid-Pecht | |
| 7,634,137 B2 | 12/2009 | Simard | |

(Continued)

OTHER PUBLICATIONS

Panicacci et al. U.S. Appl. No. 16/827,960, filed Mar. 24, 2020.

*Primary Examiner* — Albert H Cutler
(74) *Attorney, Agent, or Firm* — Treyz Law Group, P.C.

(57) ABSTRACT

Imaging circuitry may include circuits for implementing feature extraction in the analog domain. The imaging circuitry may include pixels configured to generate pixel values. The pixel values may then be weighted using variable charge integration times, variable resistors in the readout path, and/or variable switch on times in the readout path. The weighted pixels values may be binned and combined to obtain an output neuron voltage for at least one layer in a neural network. Performing feature extraction in the analog domain for each layer of results in the neural network saves power and area by avoiding the need to move data around to conventional digital memories.

17 Claims, 15 Drawing Sheets

(56) References Cited

U.S. PATENT DOCUMENTS

| | | | |
|---|---|---|---|
| 8,433,098 B1 | 4/2013 | Medasani | |
| 8,625,902 B2 | 1/2014 | Baheti | |
| 9,503,606 B2 | 11/2016 | Compton | |
| 9,558,550 B2 | 1/2017 | Klauschen | |
| 10,636,830 B2* | 4/2020 | Narui | H04N 5/379 |
| 2004/0096124 A1* | 5/2004 | Nakamura | H04N 5/35554 |
| | | | 382/308 |
| 2006/0158542 A1* | 7/2006 | Mizuno | G01J 1/46 |
| | | | 348/308 |
| 2006/0274176 A1* | 12/2006 | Guidash | H04N 5/3559 |
| | | | 348/300 |
| 2010/0118167 A1* | 5/2010 | Johnson | H04N 5/3745 |
| | | | 348/294 |
| 2016/0189381 A1 | 6/2016 | Rhoads | |
| 2016/0337567 A1* | 11/2016 | Okura | H04N 5/347 |
| 2020/0036917 A1* | 1/2020 | Komai | H04N 5/347 |
| 2020/0137325 A1* | 4/2020 | Mori | H04N 5/2173 |
| 2020/0161352 A1* | 5/2020 | Takahashi | H01L 27/14623 |

* cited by examiner

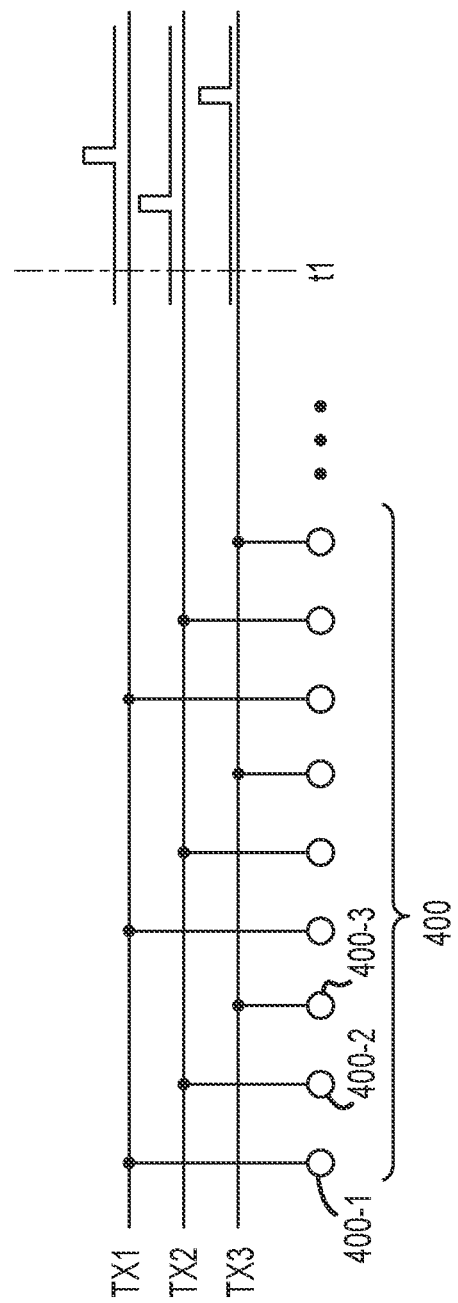

IMAGING SYSTEMS AND METHODS FOR PERFORMING PIXEL BINNING AND VARIABLE INTEGRATION FOR ANALOG DOMAIN REGIONAL FEATURE EXTRACTION

This application claims the benefit of provisional patent application No. 62/887,748, filed Aug. 16, 2019, which is hereby incorporated by reference herein in its entirety.

BACKGROUND

This relates generally to imaging devices, and more particularly, to imaging devices having image sensor pixels on wafers that are stacked on other image readout/signal processing wafers.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Imaging systems may implement convolutional neural networks (CNN) to perform feature extraction (i.e., to detect one or more objects, shapes, edges, or other scene information in an image). Feature extraction can be performed in a smaller region of interest (ROI) having a lower resolution than the entire pixel array. Typically, the analog pixel values in the lower resolution ROI are read out, digitized, and stored for subsequent processing for feature extraction and convolution steps.

BRIEF DESCRIPTION OF THE DRAWINGS

FIG. 6B is a diagram showing how a row of image pixels can be controlled using multiple charge transfer control lines in accordance with an embodiment.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
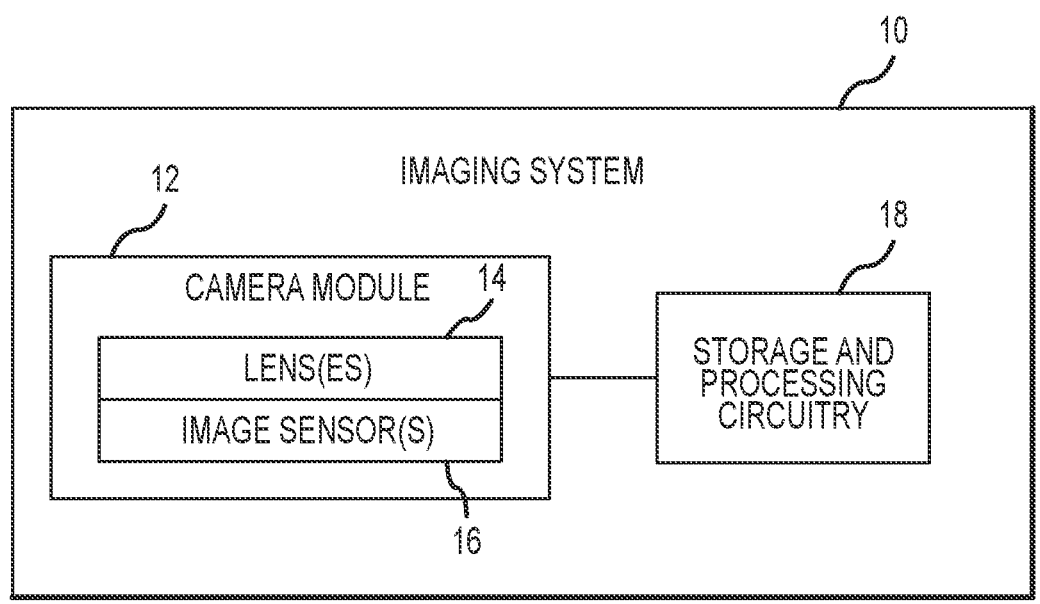
FIG. 1 is a diagram of an illustrative electronic device having an image sensor and processing circuitry for capturing images using an array of image pixels in accordance with some embodiments.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

In accordance with an embodiment, groups of pixel values in the analog domain may be processed to extract features associated with objects in a scene. The pixel information is not being digitized from a low resolution region of interest. The feature information extracted from a pixel array can be processed in multiple steps of a convolutional neural network (as an example) using this analog implementation to identify scene information for the system, which can then be used to decide whether or not to output pixel information at a higher resolution in that region of the scene.

Die stacking may be leveraged to allow the pixel array to connect to corresponding region of interest (ROI) processors to enable efficient analog domain feature extraction (e.g., to detect object features of interest and temporal changes for areas of the array that are not being read out at full resolution through the normal digital signal processing path). Extracted features may be temporarily stored in the analog domain, which can be used to check for changes in feature values over time and to detect changes in key features related to objects in the scene.

Figure 2:
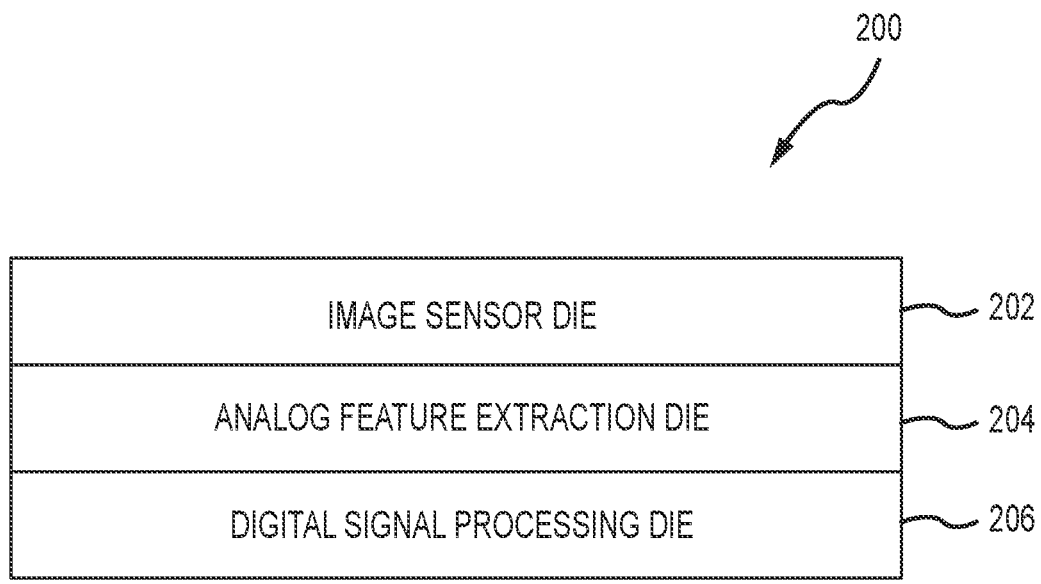
FIG. 2 is a diagram of an illustrated stacked imaging system in accordance with an embodiment.

FIG. 2 is a diagram of an illustrated stacked imaging system 200. As shown in FIG. 2, system 200 may include an image sensor die 202 as the top die, a digital signal processor die 206 as the bottom die, and an analog feature extraction die 204 that is stacked vertically between top die 202 and bottom die 206. The array of image sensor pixels reside within the top image sensor die 202; the normal digital readout circuits reside within the bottom die 206; and the analog domain feature extraction circuitry are formed within the middle die 204. If desired, other ways of stacking the various imager dies may also be used.

Figure 3:
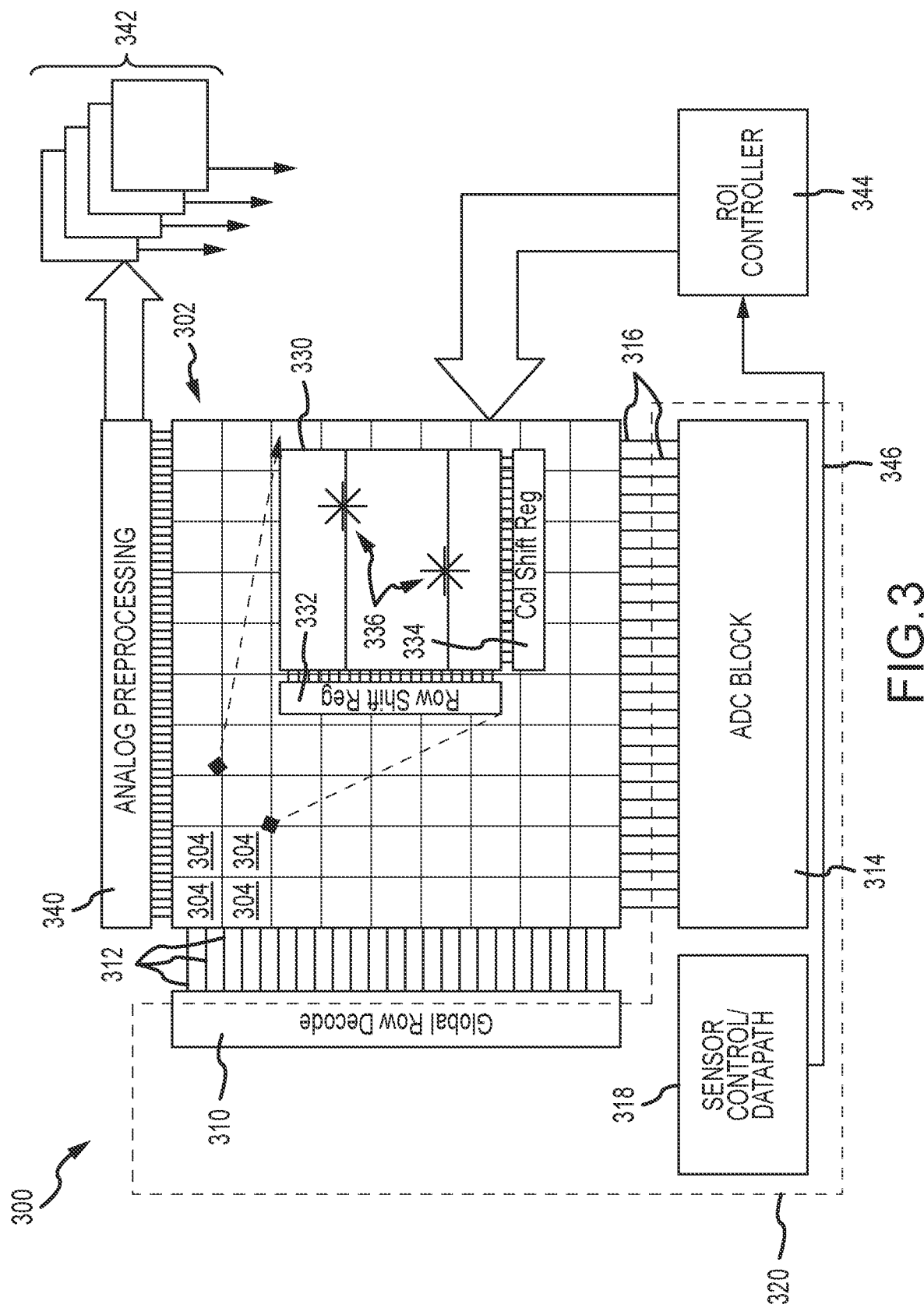
FIG. 3 is a diagram of an illustrative image sensor array coupled to digital processing circuits and analog processing circuits in accordance with an embodiment.

FIG. 3 is a diagram of an illustrative image sensor array 302 coupled to digital processing circuits and analog processing circuits. The digital signal processing circuits are delineated by dotted box 320, which include a global row decoder 310 configured to drive all the pixel rows within array 302 via row control lines 312, an analog-to-digital converter (ADC) block 314 configured to receive pixels values via each pixel column through the normal readout paths 316, and a sensor controller 318. These digital signal processing circuits 320 may reside within the bottom die 206 (see FIG. 2).

The image pixel array 302 may be formed on the top image sensor die 202. Pixel array 302 may be organized into groups sometimes referred to as "tiles" 304. Each tile 304 may, for example, include 256×256 image sensor pixels. This tile size is merely illustrative. In general, each tile 304 may have a square shape, a rectangular shape, or an irregular shape of any suitable dimension (i.e., tile 304 may include any suitable number of pixels).

Each tile 304 may correspond to a respective "region of interest" (ROI) for performing feature extraction. A separate ROI processor 330 may be formed in the analog die 204 below each tile 304. Each ROI processor 330 may include a row shifter register 332, a column shift register 334, and row control and switch matrix circuitry for selectively combining the values from multiple neighboring pixels, as represented by converging lines 336. Signals read out from each ROI processor 330 may be fed to analog processing and multiplexing circuit 340 and provided to circuits 342. Circuits 342 may include analog filters, comparators, high-speed ADC arrays, etc. Sensor control 318 may send signals to ROI controller 344, which controls how the pixels are read out via the ROI processors 330. For example, ROI controller 344 may optionally control pixel reset, pixel charge transfer, pixel row select, pixel dual conversion gain mode, a global readout path enable signal, a local readout path enable signal, switches for determining analog readout direction, ROI shutter control, etc. Circuits 330, 340, 342, and 344 may all be formed within the analog die 204.

An imaging system configured in this way may support content aware sensing. The analog readout path supports rapid scanning for shape/feature detection, non-destructive intensity thresholding, temporal events, and may also use on-board vision smart components to process shapes. The high-speed ROI readout path can also allow for digital accumulation and burst readout without impact to the normal frame readout. This content aware sensor architecture reads out different regions at varying resolutions (spatial, temporal, bit depth) based on the importance of that part of the scene. Smart sensors are used to monitor activity/events in regions of the image that are not read out at full resolution to determine when to wake up that region for higher resolution processing. The analog feature extraction supports monitoring of activity in those particular regions of interest without going into the digital domain. Since the analog feature extraction does not require processing through an ADC, a substantial amount of power can be saved.

Figure 4A:
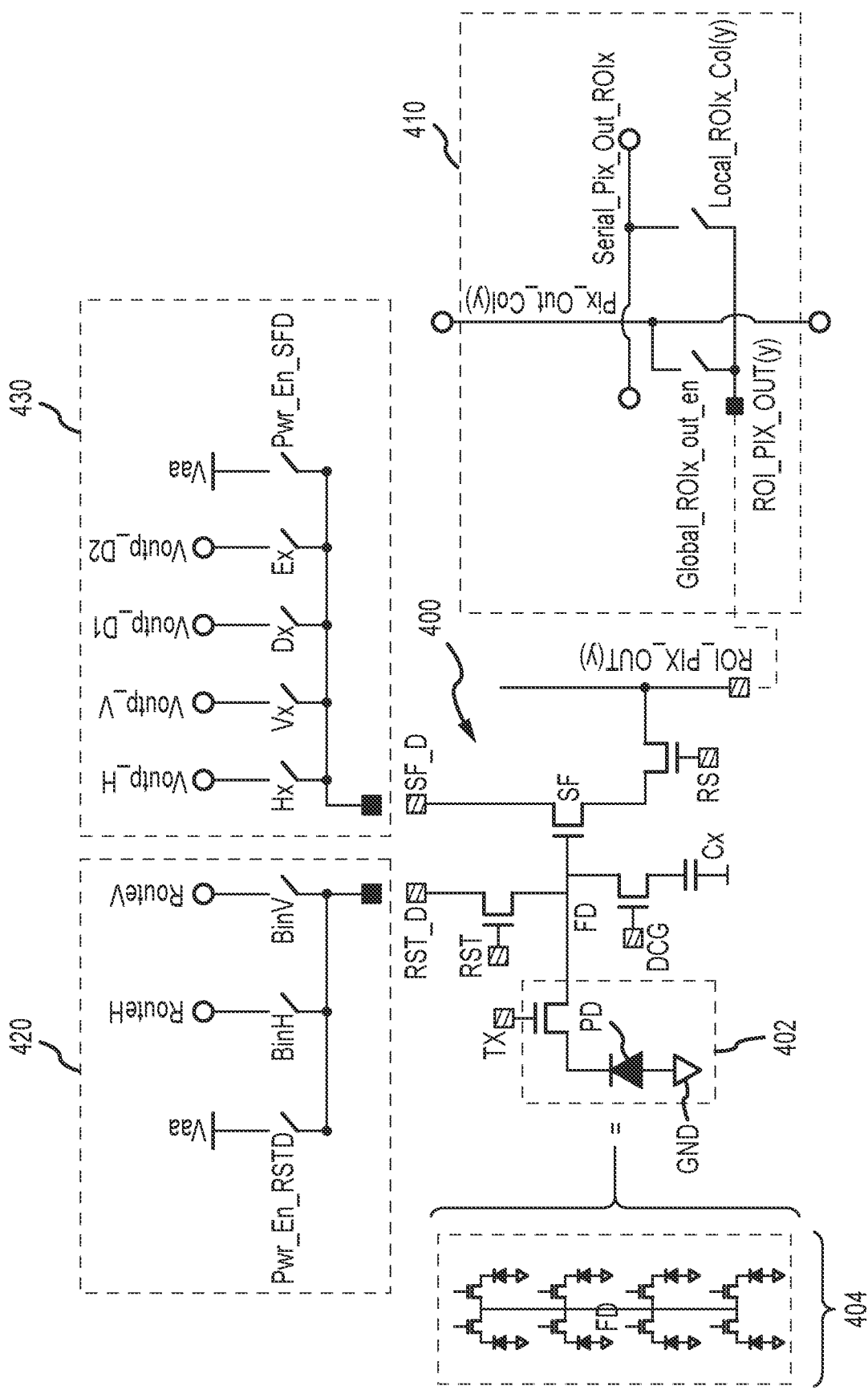
FIG. 4A is a diagram showing how an image pixel may be connected to a particular region of interest (ROI) via various switch networks in accordance with an embodiment.

FIG. 4A is a diagram showing how an image pixel may be connected to a particular region of interest (ROI) via various switch networks. As shown in FIG. 4A, an image sensor pixel such as pixel 400 may include a photodiode PD coupled to a floating diffusion node FD via a charge transfer transistor, a reset transistor coupled between the FD node and a reset drain node RST_D (sometimes referred to as a reset transistor drain terminal), a dual conversion gain (DCG) transistor having a first terminal connected to the FD node and a second terminal that is coupled to capacitor Cx, a source follower transistor with a drain node SF_D, a gate terminal connected to the FD node, and a source node coupled to the ROI pixel output line via a corresponding row select transistor. Capacitor Cx may be a fixed capacitor for charge storage purposes or a variable capacitor to provide additional gain control. Portion 402 of pixel 400 may alternatively include multiple photodiodes that share a single floating diffusion node, as shown by configuration 404.

In the example of FIG. 4A, each reset drain node RST_D within an 8×8 pixel cluster may be coupled to a group of reset drain switches 420. This is merely illustrative. In general, a pixel cluster that share switches 420 may have any suitable size and dimension. Switches 420 may include a reset drain power enable switch that selectively connects RST_D to positive power supply voltage Vaa, a horizontal binning switch BinH that selectively connects RST_D to a corresponding horizontal routing line RouteH, a vertical binning switch BinV that selectively connects RST_D to a corresponding vertical routing line RouteV, etc. Switch network 420 configured in this way enables connection to the power supply, binning charge from other pixels, focal plane charge processing.

Each source follower drain node SF_D within the pixel cluster may also be coupled to a group of SF drain switches 430. Switch network 430 may include a SF drain power enable switch Pwr_En_SFD that selectively connects SF_D to power supply voltage Vaa, switch Hx that selectively connects SF_D to a horizontal line Voutp_H, switch Vx that selectively connects SF_D to a vertical line Voutp_V, switch Dx that selectively connects SF_D to a first diagonal line Voutp_D1, switch Ex that selectively connects SF_D to a second diagonal line Voutp_D2, etc. Switches 430 configured in this way enables the steering of current from multiple pixel source followers to allow for summing/differencing to detect shapes and edges and connection to a variable power supply.

Each pixel output line ROI_PIX_OUT(y) within the pixel cluster may also be coupled to a group of pixel output switches 410. Switch network 410 may include a first switch Global_ROIx_out_en for selectively connecting the pixel output line to a global column output bus Pix_Out_Col(y) and a second local switch Local_ROIx_Col(y) for selectively connecting the pixel output line to a local ROI serial output bus Serial_Pix_Out_ROIx that can be shared between different columns. Configured in this way, switches 410 connects each pixel output from the ROI to one of the standard global output buses for readout, to a serial readout bus to form the circuit used to detect shapes/edges, to a high speed local readout signal chain, or a variable power supply.

Figure 4B:
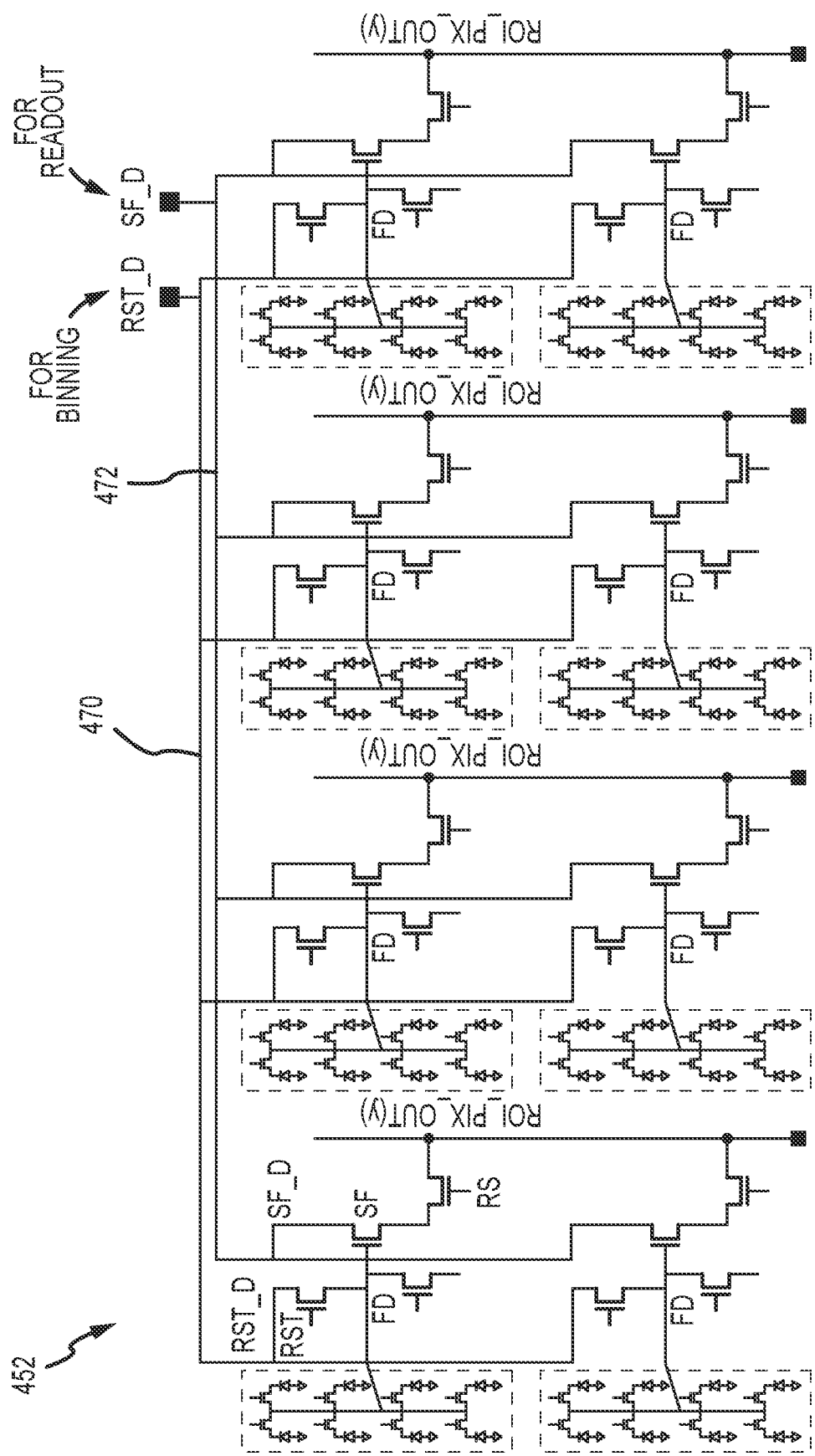
FIG. 4B is a diagram of an illustrative 8×8 pixel cluster in accordance with an embodiment.

FIG. 4B is a diagram of an illustrative 8×8 pixel cluster 452. A shown in FIG. 4B, the RST_D nodes of each image pixel in the cluster are interconnected via a reset drain coupling path 470, whereas the SF_D nodes of each image pixel in the cluster are interconnected via a source follower drain coupling path 472. The RST_D terminals may be selectively shorted together to perform charge binning (e.g., the RST_D nodes of pixels along the same row may be coupled together to perform horizontal binning and/or the RST_D nodes of pixels along the same column may be coupled together to perform vertical binning). On the other hand, the SF_D terminals may be selectively shorted together to read out a combined current from the associated source follower transistors.

Figure 4C:
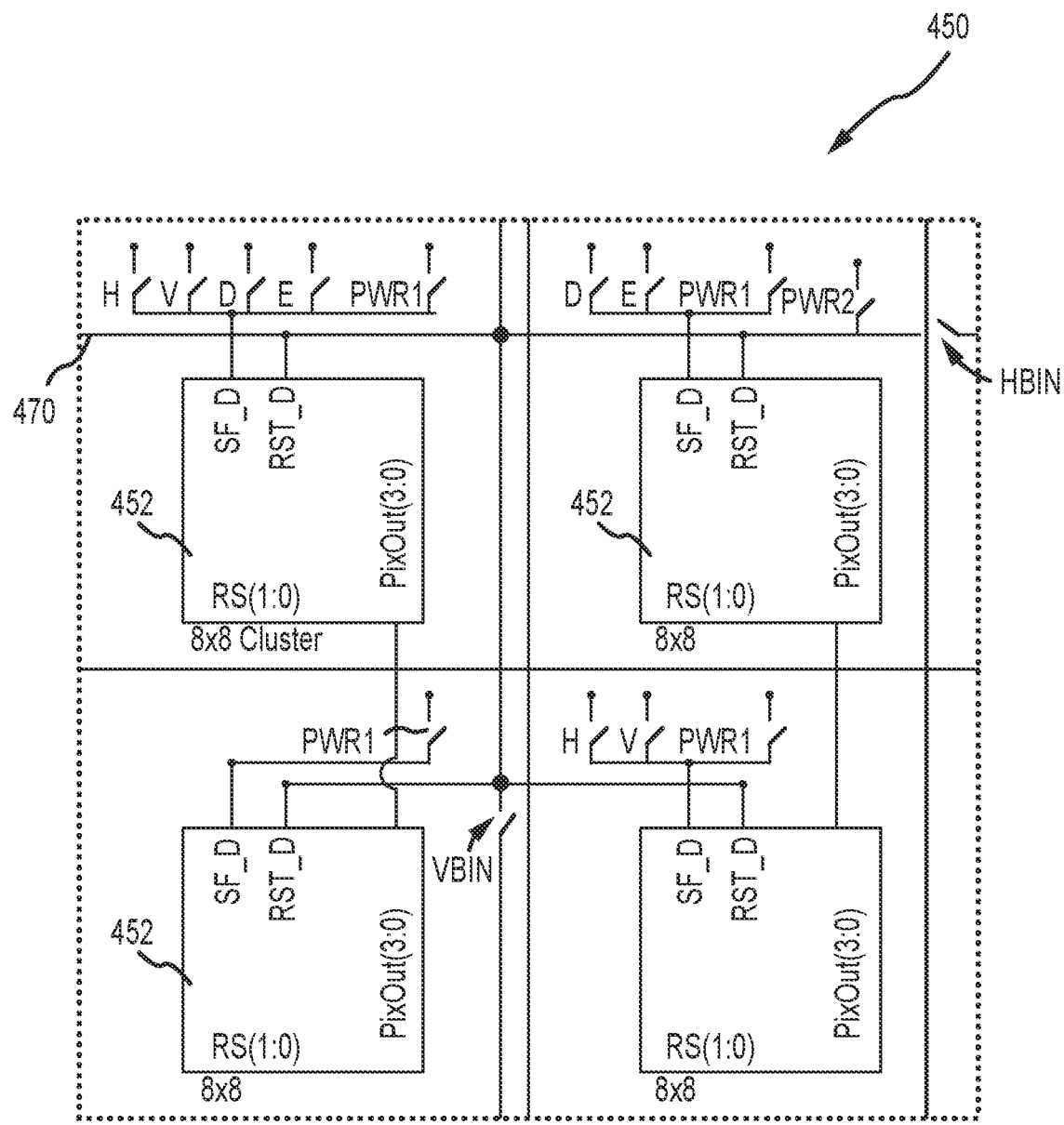
FIG. 4C is a diagram of an illustrative ROI unit cell that includes four pixel clusters in accordance with an embodiment.

FIG. 4C is a diagram of an illustrative ROI unit cell 450. In the example of FIG. 4C, each ROI unit cell 450 may include four 8×8 pixel clusters 452 that share the various switch networks described in connection with FIG. 4A. In the example of FIG. 4C, each cluster 452 may have a different number of SF_D switches. For example, the top left cluster may be coupled to five SF_D switches while the top right cluster may only be coupled to three SF_D switches. This is merely illustrative. If desired, each cluster 452 may be coupled to any suitable number of SF_D switches.

The four pixel clusters 452 within ROI unit cell 450 may have the RST_D terminals coupled together via path 470. Configured in this way, the four pixel clusters in cell 450 may be coupled to the pixel clusters in a neighboring ROI cell column by selectively turning on a horizontal binning switch HBIN and/or may be coupled to the pixel clusters in a neighboring ROI cell row by selectively turning on a vertical binning switch VBIN. The vertical/horizontal binning switches may be formed in the intermediate die 204 (FIG. 2).

Figure 4D:
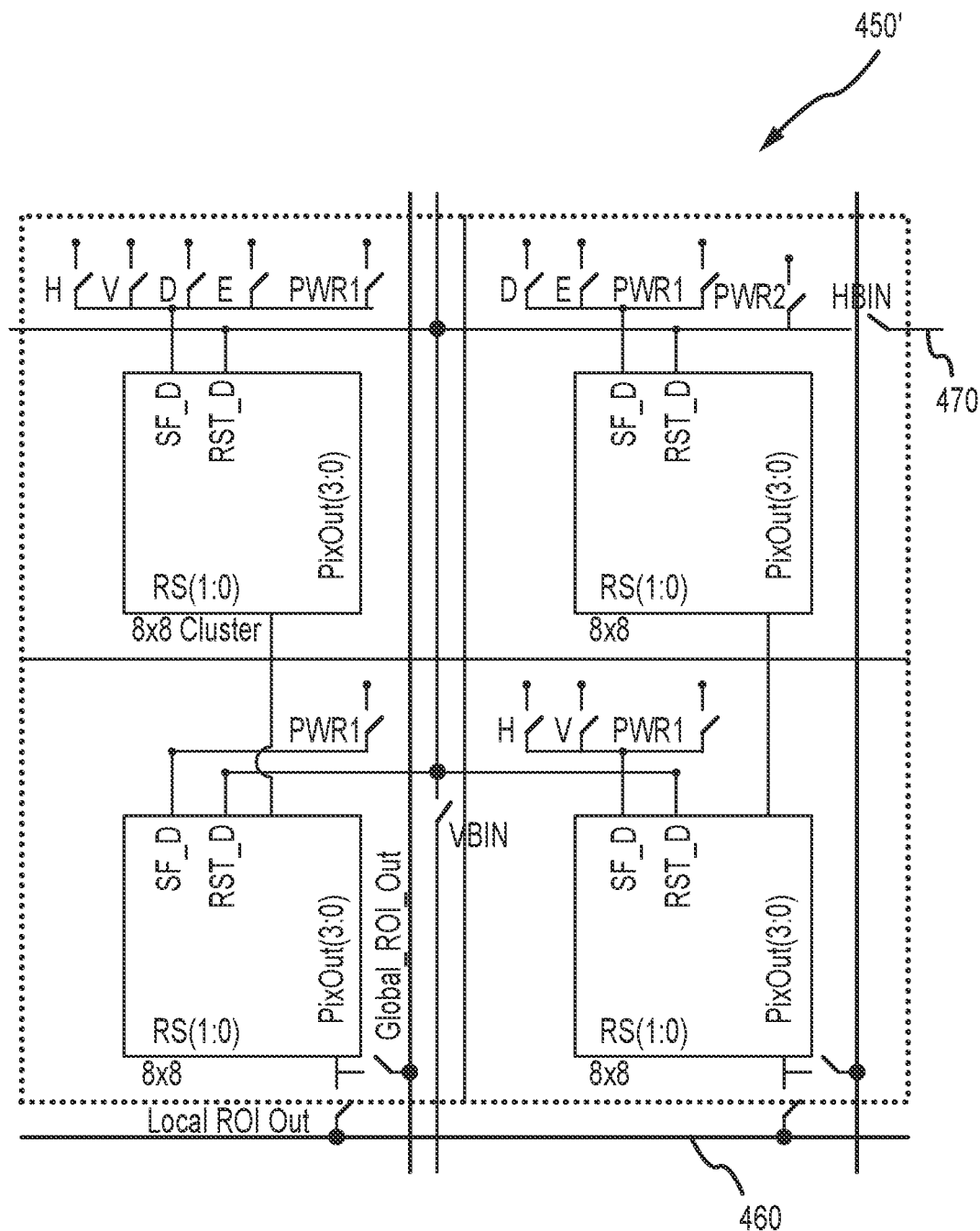
FIG. 4D is a diagram of another ROI cell formed at the bottom of each pixel column in accordance with an embodiment.

FIG. 4D is a diagram of another ROI cell 450' that can be formed at the bottom of each ROI cell column. As shown in FIG. 4D, ROI cell 450' may be configured to route the pixel output from the ROI cell to a global pixel output bus Global_ROI_Out or to a common local/serial output line Local_ROI_Out (see local serial output line 460).

Figure 4E:
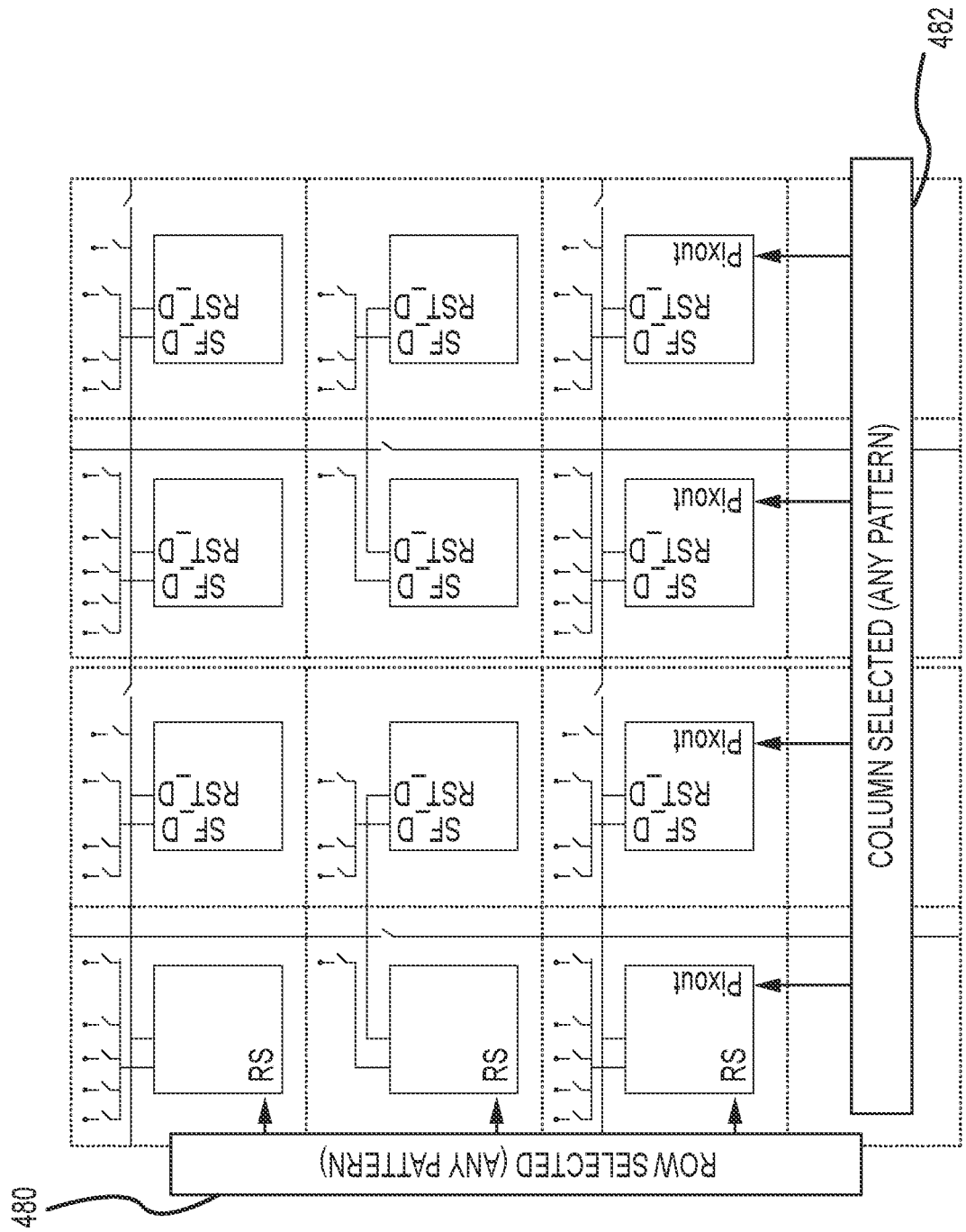
FIG. 4E is a diagram illustrating how row and column ROI selection can be controlled using row and column shift registers in accordance with an embodiment.

FIG. 4E is a diagram illustrating how row and column ROI selection can be controlled using row shift registers 480 and column shift registers 482 along with additional logic gates in accordance with an embodiment. For example, row shift registers 480 may be configured to output control signals to the row select transistors within each pixel cluster. Column shift registers 482 may be configured to output control signals to the local ROI column switch (see Local_ROIx_Col(y) switch in 410 of FIG. 4A) to control the local ROI connections. The row selection and column selection shift registers for controlling the various switch networks within each ROI unit cell may all be formed in the intermediate analog die 204.

Figure 5:
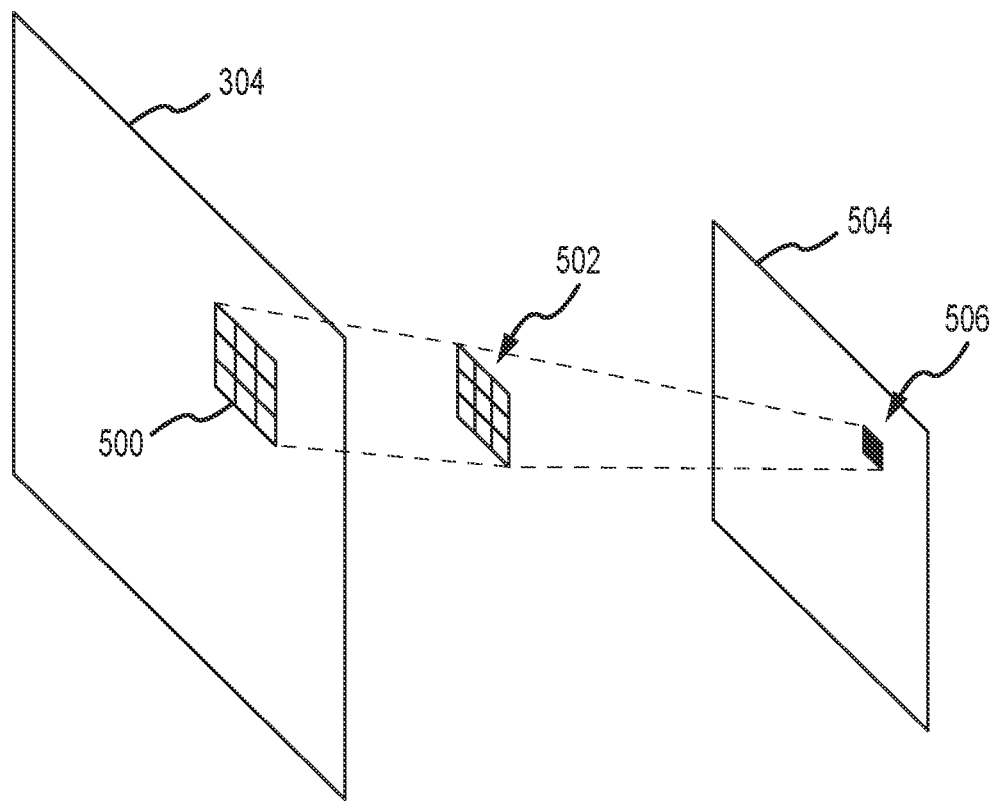
FIG. 5 is a diagram showing how a convolution kernel may be applied to an ROI to extract features in accordance with an embodiment.

Machine vision applications use algorithms to find features and objects using fundamental operations that weight groups of pixels and sum them together. FIG. 5 is a diagram showing how a convolution kernel 502 may be applied to a tile 304 or ROI to extract features 506. Convolution kernel 502 may include a collection of weights. Convolution kernel 502 may be applied to a corresponding window 500 sliding across ROI 304. In the example of FIG. 5, kernel 502 is shown as a 3×3 matrix. This is, however, merely illustrative. Kernel 502 may be a 5×5 array of weights or a matrix of any suitable size or dimension. Each weight can either be positive or negative. Each kernel window 500 performs an analog multiply accumulate (MAC) operation (e.g., using 2 dimensional matrix multiplications) to obtain a resulting convolution feature 506. Multiple convolution features 506 may be combined into a feature map 504 that is the same size or optionally smaller than tile 304. Other ways of generating CNN layers may also be implemented.

The convolution operation illustrated in FIG. 5 is conventionally performed in the digital domain using binary values. In accordance with an embodiment, the MAC operations may be performed in the analog domain to reduce the need for excessive analog-to-digital conversion (which can save power) and to reduce the need for high bandwidth digital bus structures. For example, the MAC operation can be performed directly at the pixel level using variable integration time per pixel to perform the multiply operation and using variable gain analog summing circuits to sum multiple weighted pixel values simultaneously. The horizontal/vertical binning described in connection with FIG. 4 allows for simultaneous summing of weighted pixel values by connecting different floating diffusion nodes together via the RST_D path.

Figure 6A:
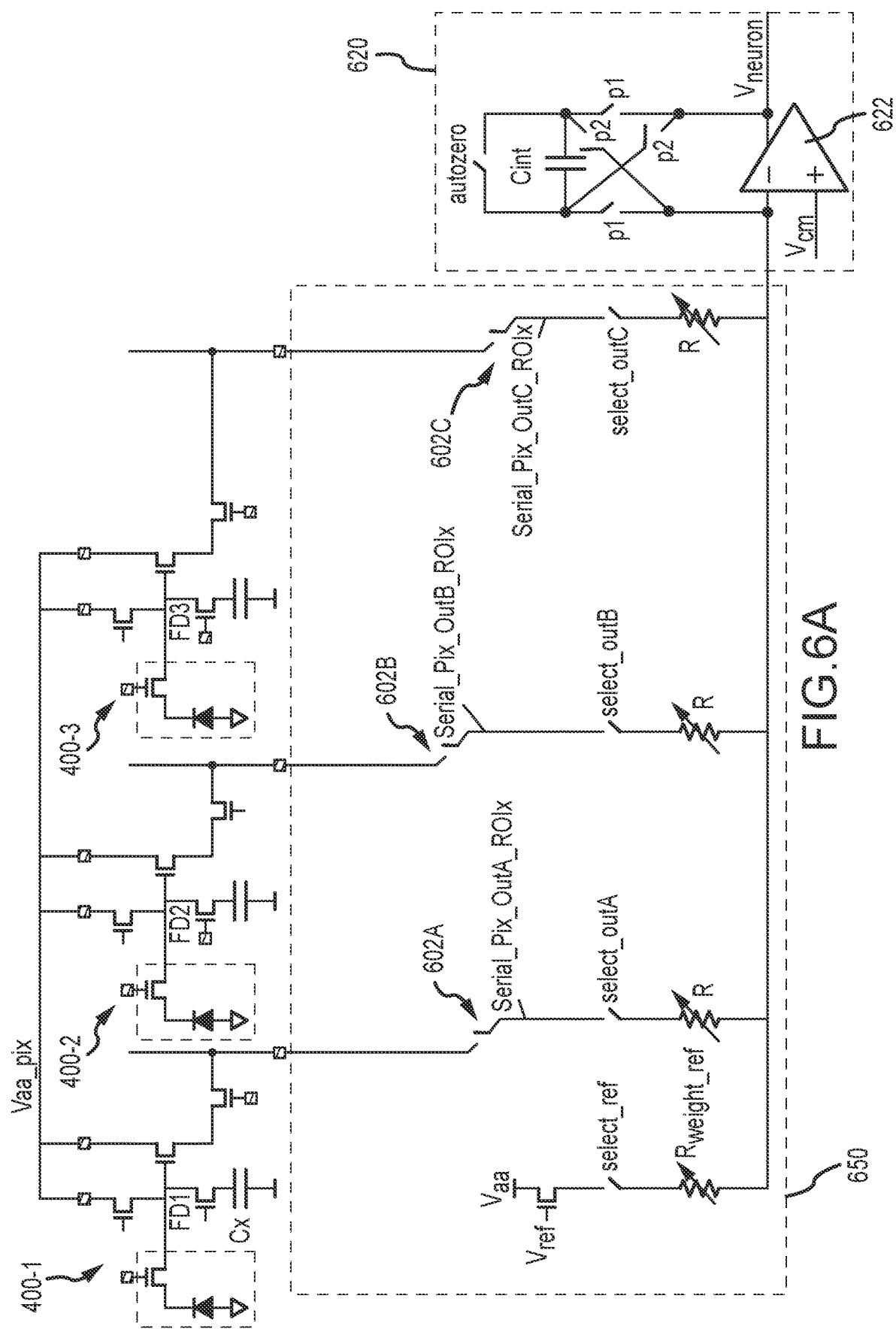
FIG. 6A is a circuit diagram showing how variable weights can be implemented using different amplifier integration durations and different pixel integration times in accordance with an embodiment.

FIG. 6A is a diagram showing how variable weights can be implemented using different amplifier integration durations or pixel integration times in accordance with an embodiment. As shown in FIG. 6A, image sensor pixels 400-1, 400-2, 400-3, and other pixels along a given row in the pixel array may have their reset drain nodes RST_D and source follower drain nodes SF_D coupled to positive power supply voltage Vaa_pix.

The pixel output line of each pixel may be selectively coupled to a negative (−) input of an integrator 620 via respective ROI control switches and resistors R. The first pixel output line ROI_PIX_OUT(1) associated with pixel 400-1 is coupled to a first serial output bus Serial_Pix_OutA_ROIx via local ROI column switch 602A, which is selectively coupled to the integrator input via a first selection switch controlled by signal Select_outA and via a first resistor R. The second pixel output line ROI_PIX_OUT(2) associated with pixel 400-2 is coupled to a second serial output bus Serial_Pix_OutB_ROIx via local ROI column switch 602B, which is selectively coupled to the integrator input via a second selection switch controlled by signal Select_outB and via a second resistor R. The third pixel output line ROI_PIX_OUT(3) associated with pixel 400-3 is coupled to a third serial output bus Serial_Pix_OutC_ROIx via local ROI column switch 602C, which is selectively coupled to the integrator input via a third selection switch controlled by signal Select_outC and via a third resistor R. The serial output bus is a separate local output bus that is part of the ROI processing, which allows this kernel operation to occur in parallel across the entire pixel array. This separate serial/local bus also allows normal imaging mode readout to happen in parallel. The resistors R may also be implemented as variable resistive circuits for additional gain control. Providing gain in the summing readout path can provide additional flexibility.

Positive power supply voltage Vaa may be selectively applied to the (−) integrator input via an adjustable resistor Rweight_ref by optionally asserting select_ref. Asserting select_ref may also optionally apply a reference or offset voltage to the integrator block. The circuits within box 650 and/or the integrator 620 may be formed as part of the intermediate analog feature extraction die 204 (see FIG. 2). Summing the differently weight pixel values can be done using a switched capacitor integrator block 620. Integrator 620 may include an amplifier 622 having a first (+) input configured to receive common mode input voltage Vcm and a second (−) terminal coupled to the different current mode paths. A shared integrating capacitor Cint may be selectively cross-coupled across the input/output of amplifier 622 using switches p1 or p2. A final Vneuron value may be generated at the output of amplifier 622. If desired, other summing mechanisms such as configurations that use a charge domain dynamic capacitor may also be used.

Pixels 400-1, 400-2, and 400-3 may be considered to be in the same pixel row but may be controlled using physically difference control lines for enabling different integration times. For instance, pixel 400-1 may be controlled using a first charge transfer control signal TX1 provided on a first control line, pixel 400-2 may be controlled using a second charge transfer control signal TX2 provided on a second control line, and pixel 400-3 may be controlled using a third charge transfer control signal TX3 provided on a third control line.

FIG. 6B is a diagram showing how a row of image pixels can be controlled using multiple charge transfer control lines. As shown in FIG. 6B, signal TX1 may be supplied to pixel 400-1 and every third pixel following 400-1 along that row, signal TX2 may be supplied to pixel 400-2 and every third pixel following 400-2 along that row, and signal TX3 may be supplied to pixel 400-3 and every third pixel following 400-3 along that row. Configured in this way, three different integration times can be supported. A first integration time may correspond to the time period between the FD node reset at time t1 and the subsequent pulse of signal TX1, a second integration time may correspond to the time period between the FD reset at time t1 and the subsequent pulse of signal TX2, and a third integration time may correspond to the time period between the FD region reset at time t1 and the subsequent pulse of signal TX3. The times at which signals TX1-TX3 are pulsed may be the same or may be different. In general, each row of pixels may be controlled using any suitable number of charge transfer control lines to support any desired number of different integration times (e.g., to enable at least two different integration times, more than three different integration times, more than four different integration times, 5-10 different integration times, or more than 10 different integration times).

If desired, the dead time between pixel integration during normal image readout can be used for feature exaction to avoid impacting the normal image frame readout. Also, in the case of content aware sensing, ROIs that are not being read out or that are read out at lower resolutions can have added time available to perform the weighted pixel integration operation.

Figure 7:
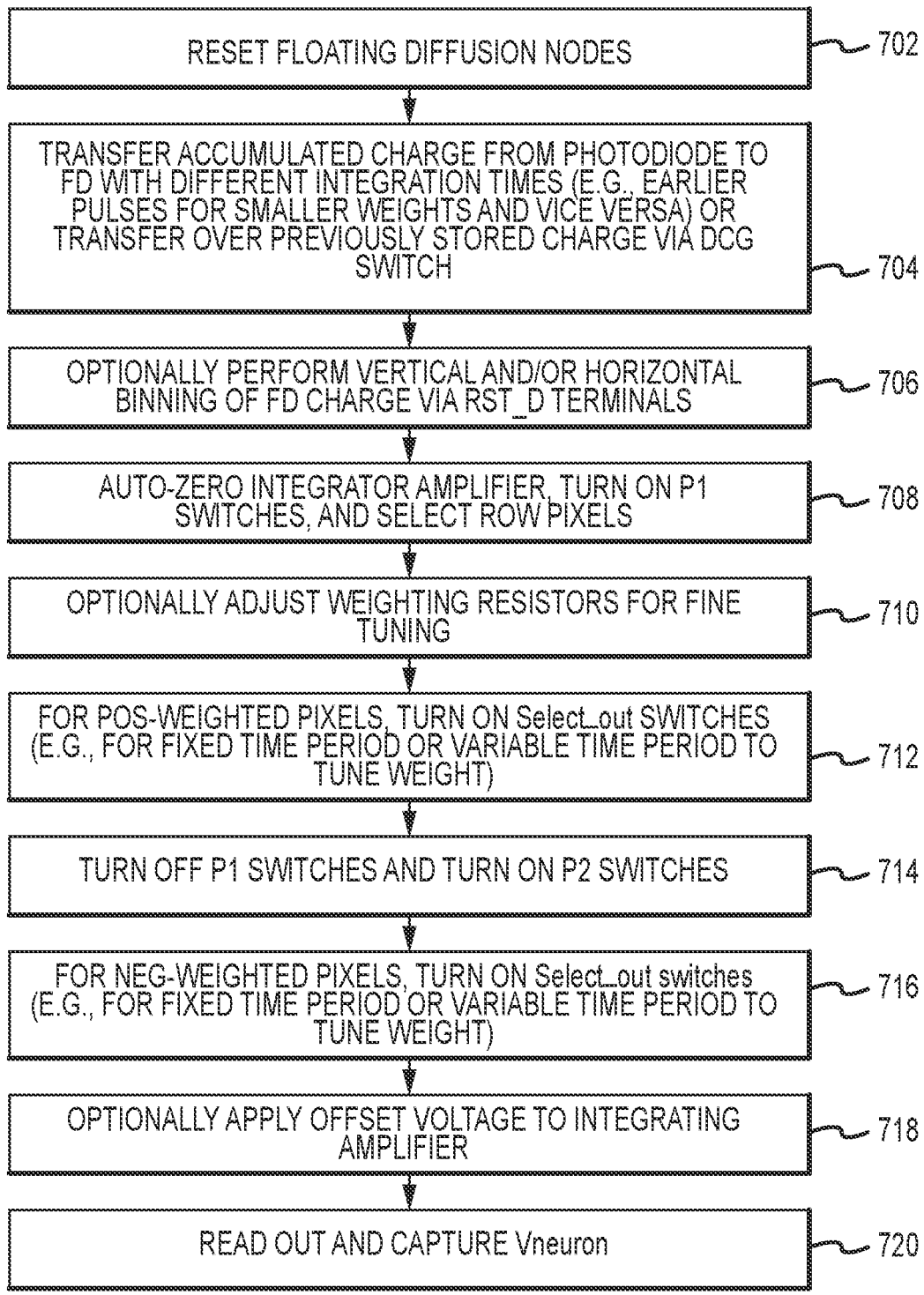
FIG. 7 is a flow chart of illustrative steps for operating circuitry of the type shown in FIGS. 6A-6B in accordance with an embodiment.

FIG. 7 is a flow chart of illustrative steps for operating circuitry of the type shown in FIGS. 6A-6B. At step 702, the floating diffusion nodes of each pixel may be reset (e.g., by turning on the reset transistors). Thereafter, the photodiode in each pixel is allowed to accumulate charge generated from impinging light.

At step 704, the accumulated charge may be transferred to corresponding floating diffusion regions via different integration times. Charge transfer signals that are pulsed earlier provide shorter integration times, whereas charge transfer signals that are pulsed later provide longer integration times. Operated in this way, the shorter integration times may be used to apply smaller kernel weights, whereas the longer integration times may be used to apply larger kernel weights. Alternatively, instead of turning on the charge transfer switch, charge that was previously stored on capacitor Cx (see FIG. 4A) may be transferred to the floating diffusion region via the DCG switch.

At step 706, vertical binning and/or horizontal binning may be performed to combine the floating diffusion region charge sensed via the RST_D terminals. In other words, multiple pixels arranged along the same column and/or along the same row may be shorted together via the RST_D nodes to detect a combined floating diffusion charge level.

At step 708, autozeroing operations may be performed on the integrator amplifier, the p1 switches may be turned on, and a row of pixels may be selected for readout. At step 710, the series resistors R may be optionally adjusted for fine tuning the gain or weighting factor.

At step 712, the Select_out switches for the positive weighted pixels may be turned on, and integrator 620 may be allowed to integrate for a fixed period to time to allow charge at its input and output to settle or for a variable time period to further fine tuning the positive weighting factor.

At step 714, the p1 switches may be turned off, and the p2 switches may be turned on. At step 716, the Select_out switches for the negative weighted pixels may be turned on, and integrator 620 may be allowed to integrate for a fixed period to time to allow charge at its input and output to settle or for a variable time period to further fine tuning the positive weighting factor. During this time, the charge from the negative weighted columns will subtract out from the positive weighted column values (i.e., to compute a difference between the positively weighted and negatively weighted pixel values).

At step 718, an offset voltage may optionally be applied to the integrating amplifier (e.g., by selectively asserting the select_ref switch of FIG. 6A). At step 720, a final Vneuron value may be output by amplifier 622 and subsequently captured.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Figure 8:
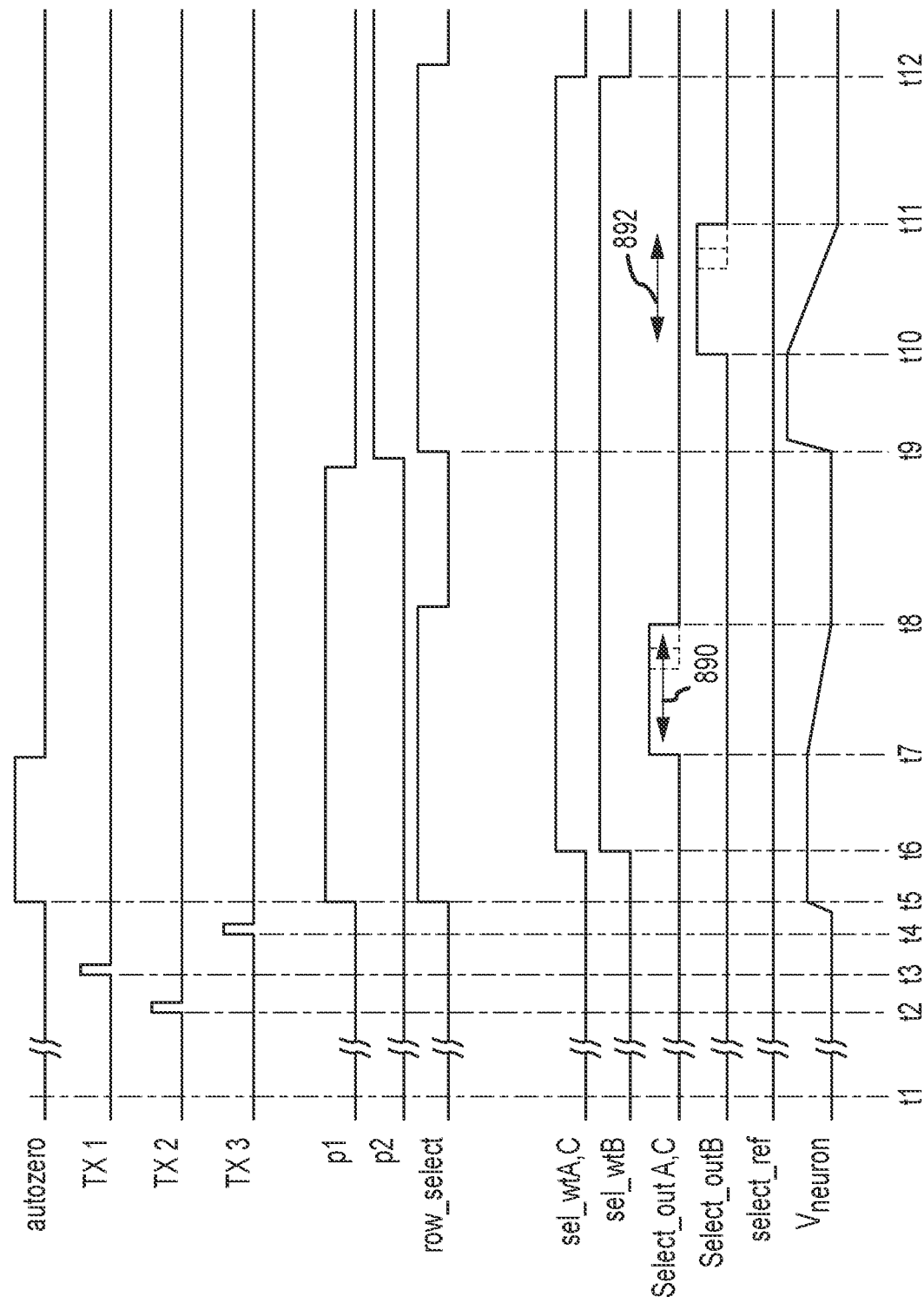
FIG. 8 is a timing diagram showing relevant signal waveforms for operating the circuitry shown in FIGS. 6A-6B in accordance with an embodiment.

The voltage level of the various relevant signals associated with operating the circuitry of FIG. 6A-6B using the steps of FIG. 7 are illustrated in the timing diagram of FIG. 8. At time t1, the floating diffusion nodes of each pixel to be read out may be reset to a reset level.

After time t1, variable pixel integration times may be implemented to apply the desired kernel weighting factors. In the example of FIG. 8, signal TX2 may first be pulsed at time t2 to provide a first (shortest) integration time (i.e., to apply a small kernel weight). Signal TX1 may then be pulsed at time t3 to provide a second (longer) integration time (i.e., to apply an intermediate kernel weight). Signal TX3 may be pulsed last at time t4 to provide a third (longest) integration time (i.e., to apply a large kernel weight). More than three or fewer than three charge transfer (TX) signals may be used to implement any suitable number of variable integration times, if desired.

At time t5, the autozero switch, the p1 switches, and the row select switches may all be turned on. At time t6, the size of all weighting resistors R may optionally be set (e.g., by selectively asserting the sel_wtX bits). In the example of FIG. 8, columns A and C may correspond to the positive weighted pixel columns, whereas column B may correspond to the negative weighted pixel columns.

At time t7, the Select_out switches for the positive weighted columns may be activated to allow the positive weighted charge to accumulate at capacitor Cint of the integrator. After some time, the Select_out switches for the positive weighted pixel values may be turned off (at time t8). The row select switches may also be turned off at this time.

At time t9, the p1 switches may be turned off, and the p2 switches may be turned on. The row select switches may also be turned on. At time t10, the Select_out switches for the negative weighted pixel values may be asserted. During this time (from t10 to t11), the resulting charge associated with the negatively weighted pixel values may be transferred to integrating capacitor Cint while the polarity of the switched capacitor integrator 620 is flipped. At time t12, the kernel operation for that row is complete and all switches may be turned off.

As shown in FIG. 8, the charge transfer signals TX1, TX2, and TX3 may be pulsed at different times to transfer charge with different pixel integration times to set the weight for each pixel. In other words, the variable assertion of the different TX control lines can be adjusted to achieve the variable integration times. These TX lines may be controlled on ROI tiles to allow flexibility on how different portions of the pixel array area processed and what features need to be checked.

For small pixels where optical limitations blur an image or during detection of larger features, pixels within a close region to the original pixel can be used instead of the next weight value set by a different integration time. If desired, the Select_outA/B/C signals may also be asserted for different amplifier integration durations to set the weight for each pixel (e.g., each pixel weight may also be adjusted during the current mode readout by having variable time to transfer charge to the integrator block). In other words, the duration for which the Select_out switches are enabled may also be adjusted to further fine tune the kernel weights (see arrows 890 and 892). For example, the Select_outA switch may be turned on using a relatively short pulse to reduce the corresponding overall gain, whereas the Select_outB switch may be turned on using a relatively longer pulse to increase the corresponding overall gain. In general, timing the pixel summing path can also be used to set the pixel weight, either to fine tune the gain, to apply a global gain, or apply all of the weight of that pixel.

Figure 9A:
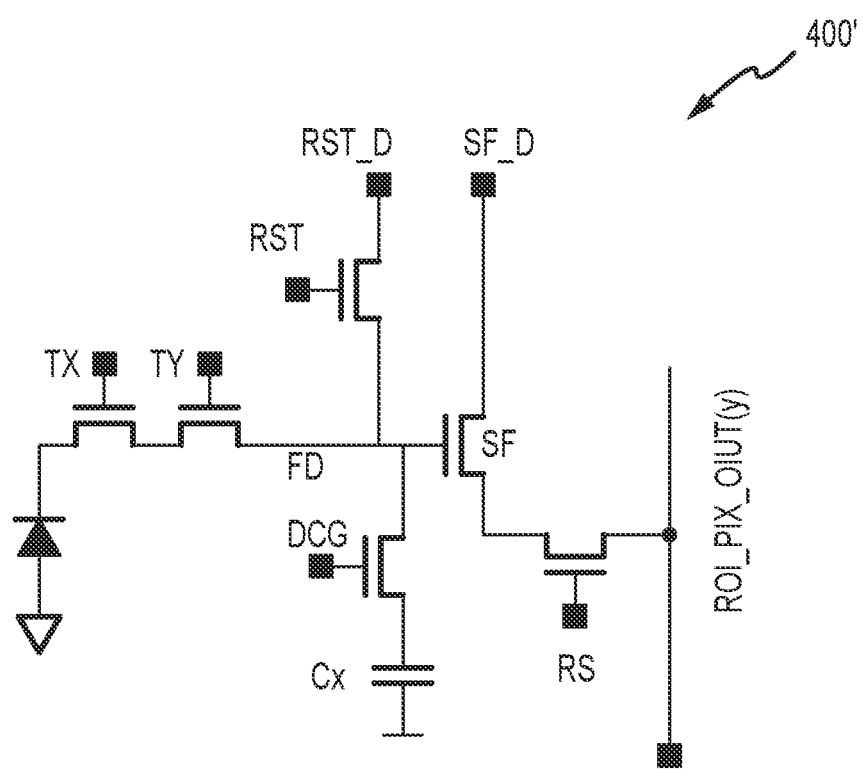
FIG. 9A is a diagram of an illustrative image sensor pixel having two charge transfer gates in accordance with an embodiment.

Performing multiply operations of pixel values by a weight using variable integration times in this way in the analog domain for each layer of results in the neural network saves power and area by avoiding the need to move data around to the conventional digital memories. The variable integration time is enabled by independently controlling the transfer gates for a region of pixels. Alternatively, weighting can be enabled by having two series transfer gates within each pixel to allow per pixel integration time control where the first transfer gate pulses periodically for a given row and where the second transfer gate blocks or allows charge transfer from the first gate (see, e.g., pixel 400' in FIG. 9A). As shown in FIG. 9A, a first charge transfer switch in pixel 400' may be controlled using a TX signal that is shared across a row of pixels, whereas a second charge transfer switch in pixel 400' may be controlled using a TY signal that is shared across a column of pixels. This equivalent pixel structure may also be used to support global shutter pixel operation, where the two transfer gates are configured as storage nodes.

Figure 9B:
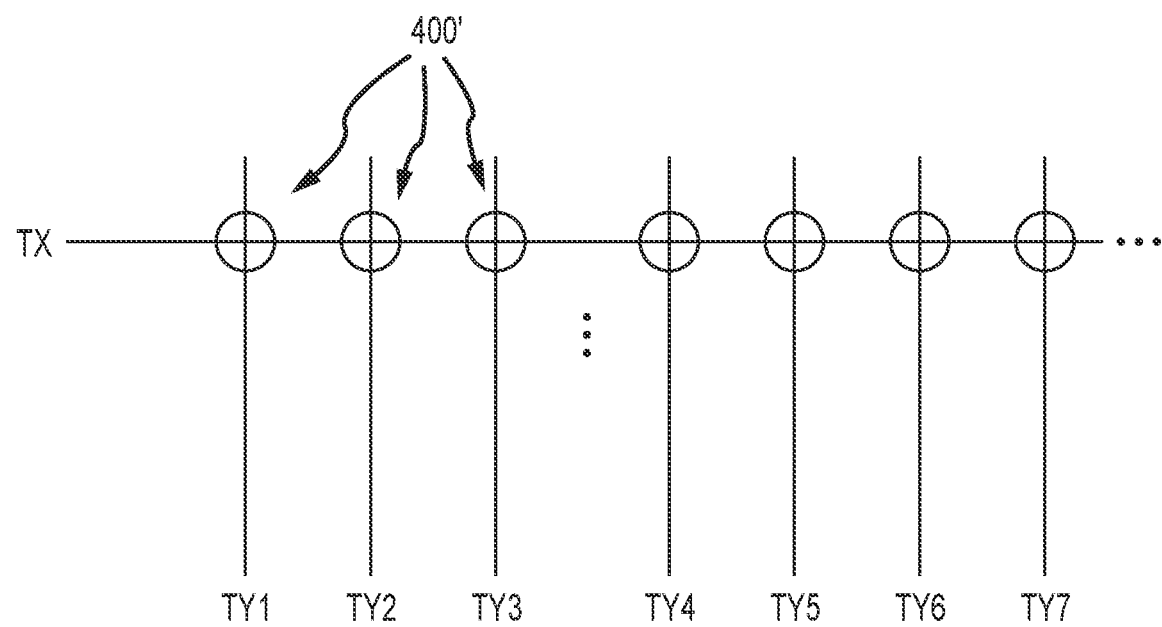
FIG. 9B is a diagram showing how the image sensor pixel of FIG. 9A can be controlled using row and column charge transfer control lines in accordance with an embodiment.

FIG. 9B is a diagram showing how the image sensor pixel of FIG. 9A can be controlled using row and column charge transfer control lines. As shown in FIG. 9B, signal TX may be provided to each pixel 400' arranged along a given pixel row. The actual integration time of each pixel 400' may be controlled by the column signal TX. For example, the integration time of pixel 400' in the first column may be controlled by when column charge transfer signal TY1 is pulsed; the integration time of pixel 400' in the second column may be controlled by when column charge transfer signal TY2 is pulsed; the integration time of pixel 400' in the third column may be controlled by when column charge transfer signal TY3 is pulsed; and so on. The configuration of FIG. 9B in which each column is controlled using a different signal TY is merely illustrative. If desired, two or more pixel columns may be controlled using a shared TY signal (e.g., every other pixel column may be controlled by the same TY signal, every third pixel column may receive the same TY signal, every fourth pixel column may receive the same TY signal, etc.).

The weighting and summing operation utilize only "passive" circuit components such as capacitors and/or resistors that move charge around. As described above, passive summing is achieved by binning multiple weighted pixel values through the RST_D node using ROI switches formed on the intermediate analog die. If desired, variable capacitor banks may be attached to the second terminal of the DCG transistor in each pixel to implement additional weighting control or as an analog memory to store intermediate results from the multiply accumulate operation when analog values are written back through the RST_D connection. If desired, multiple kernel operations with different weights can be applied either to the same pixel by binning additional charge on the FD node from the same photodiode with different additional integration times and using the gain in the readout path (e.g., by adjusting the size of the integration capacitor Cint) to normalize or scale the result Vneuron as needed. Multiple kernel operations can also be used with neighboring pixels assuming that the pixel magnitude is approximately the same. For low noise applications, individual pixel reset values can be read out and subtracted from the integrator after weighted pixel signal readout. If desired, even lower noise can be achieved using pixels with storage nodes/gates configured to hold weighted charge while the pixel reset level is first read out.

The foregoing is merely illustrative of the principles of this invention and various modifications can be made by those skilled in the art without departing from the scope and spirit of the invention. The foregoing embodiments may be implemented individually or in any combination.

What is claimed is:

1. Imaging circuitry, comprising:
   a first pixel configured to generate a first weighted pixel value using a first integration time;
   a second pixel configured to generate a second weighted pixel value using a second integration time that is different than the first integration time;

an output circuit configured to combine the first and second weighted pixel values to generate a corresponding analog output voltage;

a first set of switches that couple the first pixel to the output circuit; and a second set of switches that couple the second pixel to the output circuit, wherein the first and second pixels are formed on a first die, and wherein the first and second sets of switches and the output circuit are formed on a second die.

2. The imaging circuitry of claim 1, wherein the first and second pixels are formed in the same row in an array of pixels.

3. The imaging circuitry of claim 1, wherein the first pixel comprises a first charge transfer switch controlled by a first control signal, wherein the second pixel comprises a second charge transfer switch controlled by a second control signal, and wherein the first and second control signals are pulsed at different times.

4. The imaging circuitry of claim 1, further comprising:
a third pixel configured to generate a third weighted pixel value using a third integration time that is different than the first and second integration times.

5. The imaging circuitry of claim 1, wherein the first die is stacked on top of the second die.

6. The imaging circuitry of claim 1, further comprising:
a first resistor coupled in series with the first set of switches; and
a second resistor coupled in series with the second set of switches.

7. The imaging circuitry of claim 1, further comprising:
a first variable resistor that is coupled in series with the first set of switches and that is configured to fine tune the first weighted pixel value; and
a second variable resistor that is coupled in series with the second set of switches and that is configured to fine tune the second weighted pixel value.

8. The imaging circuitry of claim 1, wherein at least one of the first set of switches is turned on for a first adjustable duration to fine tune the first weighted pixel value, and wherein at least one of the second set of switches is turned on for a second adjustable duration to fine tune the second weighted pixel value.

9. The imaging circuitry of claim 1, wherein the first pixel comprises:
a floating diffusion region;
a dual conversion gain switch; and
a fixed capacitor coupled to the floating diffusion region via the dual conversion gain switch, wherein the fixed capacitor is configured to store a previously accumulated charge for transferring to the floating diffusion region through the dual conversion gain switch.

10. The imaging circuitry of claim 1, wherein the first pixel comprises:
a floating diffusion region;
a dual conversion gain switch; and
a variable capacitor coupled to the floating diffusion region via the dual conversion gain switch, wherein the variable capacitor is configured to fine tune the first weighted pixel value.

11. The imaging circuitry of claim 1, wherein the first weighted pixel value comprises a positive weighted pixel value, wherein the second weighted pixel value comprises a negative weighted pixel value, and wherein the output circuit is configured to compute a difference between the positive and negative weighted pixel values.

12. The imaging circuitry of claim 1, wherein the first pixel has a first reset drain terminal, wherein the second pixel has a second reset drain terminal that is shorted to the first reset drain terminal, and wherein the first reset drain terminal is selectively coupled to a first additional pixel via a horizontal binning switch or to a second additional pixel via a vertical binning switch.

13. Imaging circuitry, comprising:
a first group of pixels each that are interconnected via first reset transistor drain terminals and that are formed in a first die; and
a second group of pixels that are interconnected via second reset transistor drain terminals and that are formed in the first die, wherein the first group of pixels is selectively coupled to the second group of pixels via a binning switch linking the first and second reset transistor drain terminals, and wherein the binning switch is shared among each pixel in at least the first group of pixels and is formed in a second die that is different than the first die.

14. The imaging circuitry of claim 13, wherein at least a first pixel in the first group of pixels is configured to generate a first weighted pixel value using a first integration time, and wherein at least a second pixel in the second group of pixels is configured to generate a second weighted pixel value using a second integration time different than the first integration time.

15. The imaging circuitry of claim 13, wherein the first die is stacked on top of the second die.

16. The imaging circuitry of claim 13, wherein the first group of pixels are each coupled to a first set of switches via first source follower drain terminals, and wherein the second group of pixels are each coupled to a second set of switches via second source follower drain terminals.

17. The imaging circuitry of claim 16, wherein the first and second sets of switches are formed in the second die.

* * * * *